United States Patent [19]
Chien

[11] Patent Number: 6,154,096
[45] Date of Patent: Nov. 28, 2000

[54] LATCHED CHARGE PUMP FOR PHASE LOCKED LOOP

[75] Inventor: Hwey-Ching Chien, San Diego, Calif.

[73] Assignee: Prominent Communications, Inc, San Diego, Calif.

[21] Appl. No.: 09/240,822

[22] Filed: Feb. 1, 1999

[51] Int. Cl.$^7$ .................................. H03L 7/00; H03L 7/06
[52] U.S. Cl. .......................... 331/17; 331/1 A; 327/536; 327/537
[58] Field of Search ..................... 327/536, 537, 327/215, 219; 331/17, 1 A

[56] References Cited

U.S. PATENT DOCUMENTS 5,986,487  11/1999  Ridgers ................................ 327/157

Primary Examiner—Arnold Kinkead

[57] ABSTRACT

A charge pump of a phase comparator in a phase locked loop is provided a latched comparator to minimize the effect of "dead band" during the time between charging and discharging the loop filter of the charge pump. A latch is inserted between the charging or discharging amplifier and a reset switch which turns on either the charging amplifier or the discharging amplifier. The latch speed up the change over of the charging and discharging action due to regenerative action. The latch can be an asymmetrical flip flop with one inverter fed from a reference current source and a second inverter fed from an on/off current source as controlled by the sourcing command from the phase comparator.

9 Claims, 2 Drawing Sheets

LATCHED CHARGE PUMP FOR PHASE LOCKED LOOP

This invention relates to phase detector in a phase-locked loop, in particular to the charge pump of the phase detector.

In frequency synthesizers, a widely used method for phase detection is to use a charge pump after a phase comparator to derive a DC voltage for controlling a voltage-controlled oscillator (VCO). The DC voltage changes the frequency of the VCO until the VCO generates a frequency which is locked in phase with a reference frequency. The type of phase detector used in the design is known as "Three-state Phase Detector". The three states of the output are: "high", "low" and "high impedance". In this type of phase detector, when both outputs of the phase comparator are "high", the comparator resets both of its outputs to "low" state and turns off the sourcing and sinking currents of the charge, pump. When this happens, the output of the charge pump is in the so-called "high impedance state". The loop filter in the frequency synthesizer is charged or discharged by the charge pump to increase or decrease the control voltage for the VCO. The design has two problems: First, the VCO can change phase without producing a significant phase comparator output to activate the charging and discharging mechanism. Second, there is a time delay between the time phase comparator sending an output signal and the time the charge pump completely respond to the signal and turn on or off the output currents accordingly. Conventional design is to add a delay to the reset signal, but the added delay cannot track with the charge pump, thus causing the phase detector to reset the charge pump to the high impedance state too soon or too late. Both problems contribute to a phenomenon known as "dead band" (or "dead zone") Such an arrangement can have a dead band range in which the VCO can change phase without producing a significant phase comparator output to activate the charging and discharging mechanism. Then the VCO can fluctuate within the dead band and reduce the spectral purity of the oscillator frequency.

Byrd and Davis disclosed in U.S. Pat. No. 4,814,726 a method to minimize the adverse effect of the dead band by simultaneously sensing the sourcing and sinking current in the charge pump using two resistive load amplifiers. In Byrd's method, the reset signal is derived from a resistive load (58 or 51) of the charging amplifier (45) or discharging amplifier (50). The speed of the reset signal is therefore limited by the frequency response of the amplifier. The limited frequency response of such an amplifier may slow down the operation, and accentuate the adverse effect of the dead band in a charge pump. Another drawback of that design is that the current to drive the resistive load and the resistance of the load may vary over process and temperature variations and thus cause the trigger time of the reset signal to vary.

SUMMARY

An object of this invention is to minimize the effect of the dead band in a charge pump of a phase detector in a phase locked loop. Another object of this invention is to minimize the dithering in charge pump of a phase detector.

These objects are achieved in this invention by incorporating a latched-comparator to reset the charging and discharging amplifiers for the charge pump. The latch speeds up the transfer of sensing signal to reset the amplifier.

BRIEF DESCRIPTION OF THE INVENTION

DETAILED DESCRIPTION OF THE PRESENT INVENTION

Figure 1:
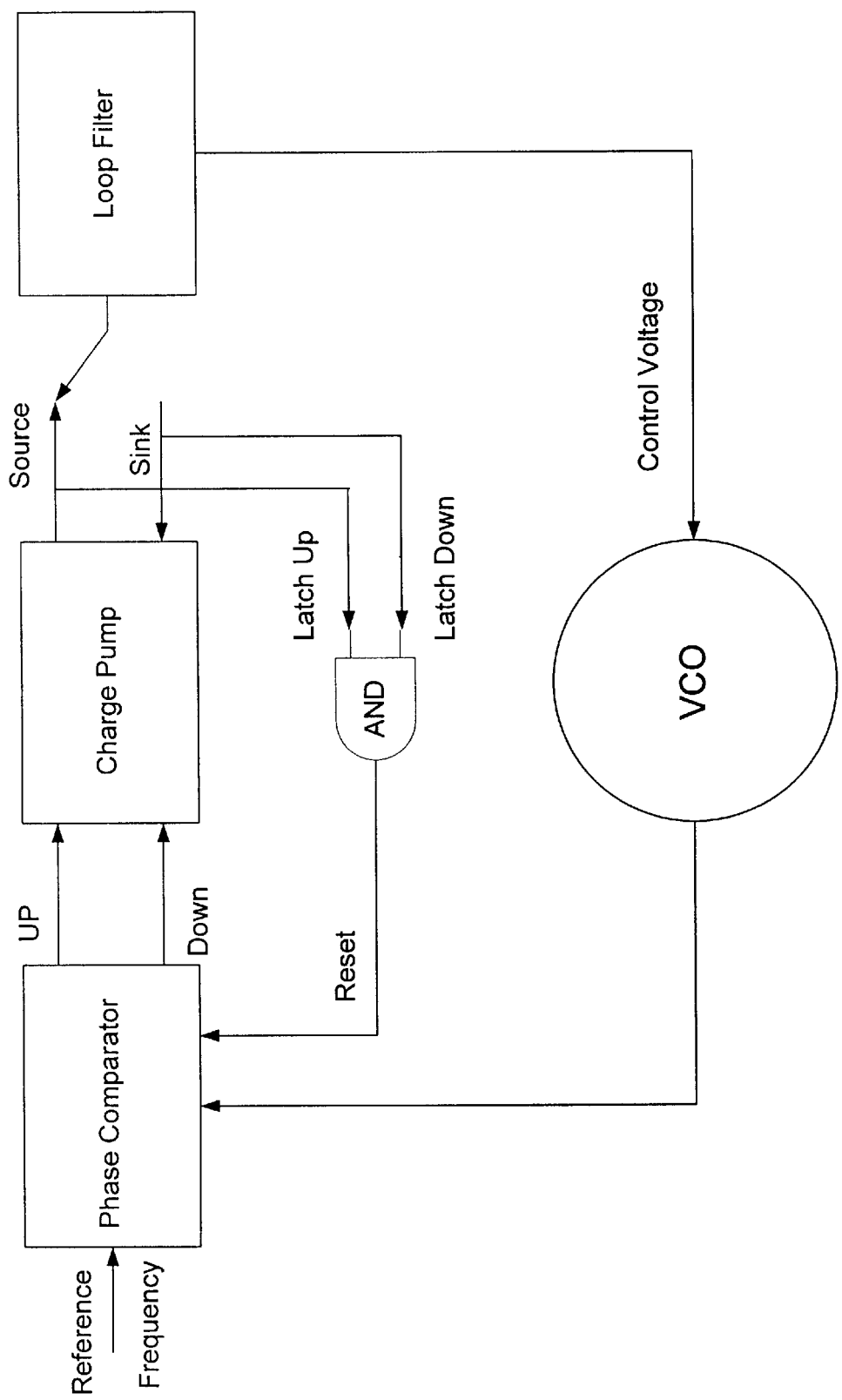
FIG. 1 shows a block diagram of the present invention.

FIG. 1 shows the block diagram of the present invention. A phase locked loop is formed with a phase comparator PD which compares the phase between a reference frequency Fin and the frequency from a voltage controlled oscillator VCO. When the two frequencies are not in phase, the phase detector produces a signal which switches between either charging and discharging a capacitor through respective amplifiers. The dc voltage developed across the capacitor is used to control the voltage applied to the VCO. In this invention, the switching interval between charging and discharging the capacitor is shortened by incorporating a current comparator to the charge pump. The current comparator behaves like a latched comparator and is used to compare a sensing current with a constant-on current which carries a predetermined value of current. The value of the sensing current is a fraction of the output current of the charge pump. Therefore, the current flowing in the sensing current source is also a fraction of the output current at any given instant. By comparing with the constant-on current, one can detect the current flowing in sensing current source as well as the charge pump current. The latching between the phase comparator output and the switch speeds up the operation to avoid the "dead band".

Figure 2:
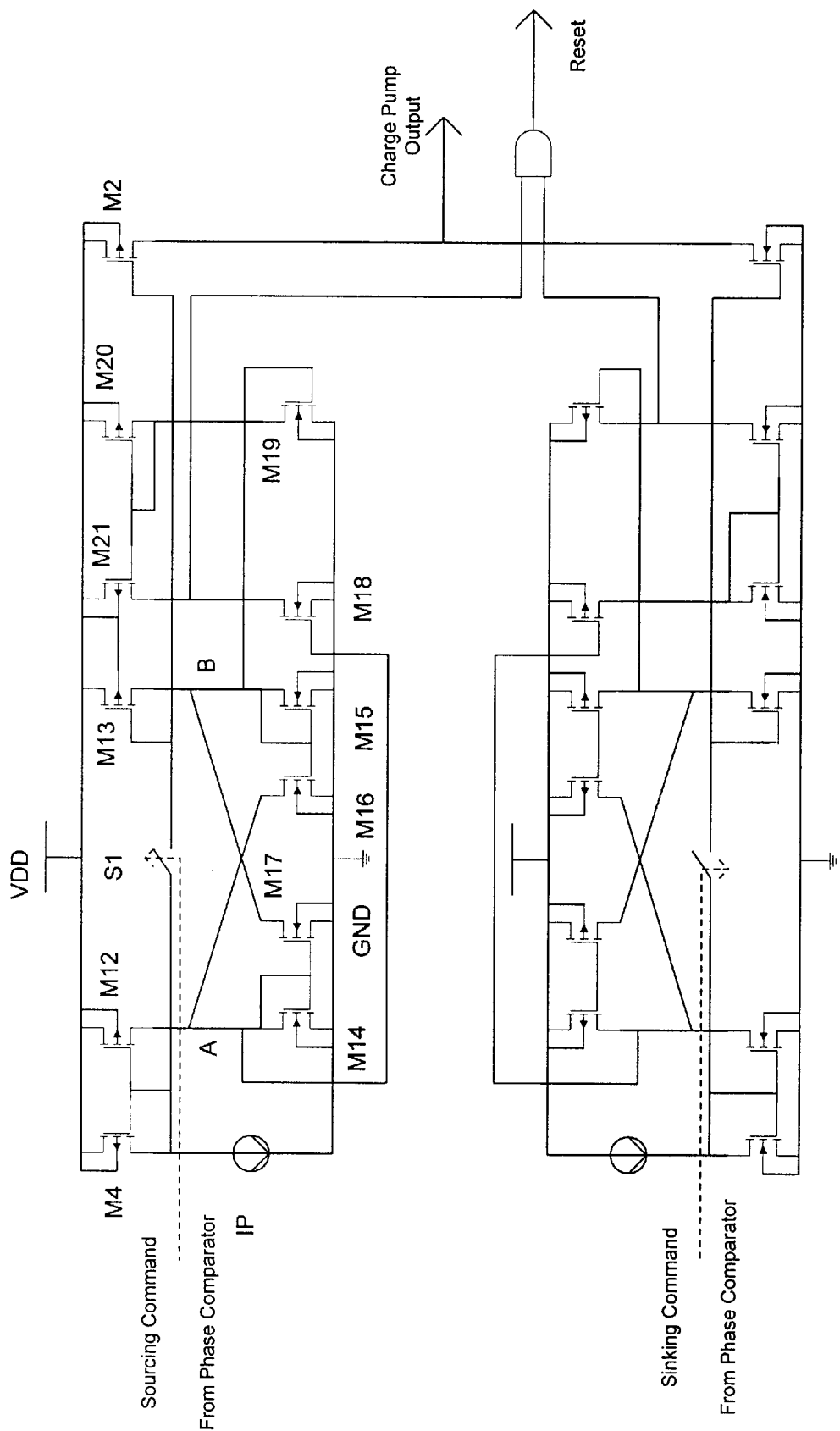
FIG. 2 shows a circuit diagram to implement the present invention.

FIG. 2 shows the circuit diagram of the present invention. M4 with the drain and the gate shorted and M12 are p-type MOSFETs (PMOS) form a current mirror from a current source Ip. The mirror output of M12 is fed to node A where the mirrored current can either feed an n-type MOSFET (NMOS) M14 with its drain and gate shorted or the drain of NMOS M16. The gate of M14 is connected to the gate of NMOS M17. The gate of M16 is connected to the gate of NMOS 15 at node B, where the drain of M17 is connected. M12 and M14 constitute an inverter with output at node A. M13 and M15 form another inverter with output at node B. The two inverters are cross-coupled through M17 and M16 to form a latch. When no current feeds point B, no current flows into the drain of M17, and the current feeding node A flows through M14 and renders the voltage at node A high at a voltage Vdsl4 higher than the threshold voltage of the MNOS. When there is current flowing into node B, the current flows to the drains of M17 and M15 and raises the drain to source voltage Vds15 of M15 and the gate voltage of M16. When M16 is turned on, the drain, which is connected to node A, robs the drain current from M14 and drops the drain to source voltage of M14 at node A. Thus the node voltage A goes down as node voltage B goes up. This change occurs very fast since the latch action is a regenerative process.

The outputs of the latch at nodes A and B are fed to a differential amplifier with a single-ended output at node C. The differential amplifier has a differential pair NMOS M18 and M19. The differential drain output of M18 and M19 is connected to a PMOS current mirror M21 and M20 to obtain a single-ended output at the common drain output at node C, which is connected to the input of a 2-input NAND gate.

The current feeding node B is controlled by the PMOS M13. When a sourcing command closes a switch S1, the drain to source voltage Vds4 of M4 appears across M13 and M2, turning them on. Then a drain current of M2 charges the loop filter of the charge pump. Meanwhile the drain current of M13 feeds the node B. Once, M13 starts to feed node B, the latch switches and node C changes state from low to high very rapidly due to regenerative action. Node C is connected to one input of the NAND gate for resetting the switch S1.

It is to be noted that the gate width-to-length ratio (W/L) of M15 is twice that of M14, the W/L ratio of M16 is twice that of M14, the W/L ratio of M13 is twice that of M12. By doing so, when the current flowing in M13 increases to equal that of M12, M16 starts to divert more current away from M14 than that is diverted from M17 by M17. When the drain current of M13 is equal to twice that of M12, the drain currents of M14 and M17 become zero; node voltage A becomes close to ground, and teh voltage B is equal to the initial value of node voltage A.

The foregoing description only one half section of a complete circuit, i.e. the up section. Another symmetrical section, the down section is used to feed the input D of the NAND gate. The output of the NAND is used to reset the charge pump. With the fast action of the latch, the reset happens rapidly and the dead band is minimized. In addition, the latched current comparator approach assures that the charge pump currents are not turned off before they reach the desired values, thus further reducing the dead band and improving the PLL performance.

While a particular embodiment of the inventions has been described, it will be apparent to those skilled in the art that various modifications may be made in the embodiment without departing from the spirit of the present invention. Such modification are all within the scope of this invention.

What is claimed is:

1. A charge pump phase comparator for a phase locked loop having a phase detector pumping a loop filter to derive a control voltage for a voltage controlled oscillator, comprising:

a phase detector a charging amplifier for charging said loop filter a discharging amplifier for discharging said loop filter;

a command for selecting said charging amplifier and discharging amplifier to be activated;

a reset means for setting said charging amplifier in condition for charging said loop filter and for setting said discharging amplifier for discharging said loop filter;

a first latch between said charging amplifier and said reset means to speed up the reset means; and a second latch between said discharging amplifier and said reset means to speed up the reset means, wherein each of said first latch and said second latch comprises two cross-coupled inverters having a first output node A and second output node B.

2. A charge pump phase comparator as described in claim 1, wherein each inverter comprises a pull-up device and pull-down current mirror with the output of the current mirror connected to the output node of the other inverter.

3. A charge pump phase comparator as described in claim 2, wherein the pull-up device is a p-type MOFET (PMOS) and the pull-down current mirror is of n-type MOFETS (NMOS).

4. A charge pump phase comparator as described in claim 3, wherein said output node A and output node B are connected to the inputs of a differential amplifier with a single-ended output, which is connected to said reset means.

5. A charge pump phase comparator as described in claim 1, wherein said differential amplifier has a pull-down NMOS, and a pull-up PMOS current mirror having a PMOS diode and an output PMOS having the same gate voltage as the PMOS diode.

6. A charge pump phase comparator as described in claim 3, wherein the pull-up PMOS of a first inverter of said cross-coupled inverters is an output PMOS of a constant current mirror.

7. A charge pump phase comparator as described in claim 6, further comprising a switch connected between the gate of the pull-up PMOS of a second inverter of said cross-coupled inverters and the gate of the output PMOS of said constant current PMOS inverter.

8. A charge pump phase comparator as described in claim 7, further comprising a pull-up PMOS for sourcing a capacitor having a gate connected to the gate of the pull-up PMOS of said second inverter.

9. A charge pump phase comparator as described in claim 4, wherein said reset means is a two-input NAND gate, having one input coupled to said first latch, and a second input coupled to said second latch.

* * * * *